United States Patent
Hong et al.

(10) Patent No.: US 7,713,867 B2
(45) Date of Patent: May 11, 2010

(54) METHOD FOR FORMING A METAL LINE IN A SEMICONDUCTOR DEVICE

(75) Inventors: Seung Hee Hong, Seoul (KR); Jung Geun Kim, Seoul (KR); Eun Soo Kim, Incheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 60 days.

(21) Appl. No.: 12/053,488

(22) Filed: Mar. 21, 2008

(65) Prior Publication Data

US 2009/0053889 A1   Feb. 26, 2009

(30) Foreign Application Priority Data

Aug. 24, 2007   (KR) .................. 10-2007-085422

(51) Int. Cl.
*H01L 21/4763* (2006.01)
(52) U.S. Cl. ............... 438/643; 438/629; 257/E21.585; 257/E21.477
(58) Field of Classification Search .................. 438/629, 438/621, 643, 646, 902; 257/E21.477, E21.585, 257/E21.586, E21.591
See application file for complete search history.

(56) References Cited

U.S. PATENT DOCUMENTS

| 4,906,591 | A | * | 3/1990 | Okumura ..................... 438/252 |
| 5,380,546 | A | * | 1/1995 | Krishnan et al. ......... 427/126.1 |
| 5,731,245 | A | * | 3/1998 | Joshi et al. .................. 438/705 |
| 5,976,975 | A | * | 11/1999 | Joshi et al. .................. 438/672 |
| 6,271,136 | B1 | * | 8/2001 | Shue et al. .................. 438/687 |
| 6,297,557 | B1 | * | 10/2001 | Bothra ........................ 257/767 |
| 7,071,564 | B1 | * | 7/2006 | Erb et al. .................... 257/774 |

FOREIGN PATENT DOCUMENTS

| KR | 1020000027932 A | 5/2000 |
| KR | 1020040043219 A | 5/2004 |

* cited by examiner

*Primary Examiner*—Caridad M Everhart
(74) *Attorney, Agent, or Firm*—Townsend and Townsend and Crew LLP

(57) ABSTRACT

A semiconductor device includes contact plugs formed in contact holes defined in an interlayer dielectric. Upper portions of the contact plugs are etched. A first barrier layer is formed on a surface of the interlayer dielectric including the contact plugs. A second barrier layer is formed on the first barrier layer over the interlayer dielectric. The second barrier layer has lower compatibility with a metallic material than the first barrier layer. A first metal layer is formed over the first and second barrier layers. The first metal layer, the first barrier layer and the second barrier layer are then patterned.

25 Claims, 3 Drawing Sheets

METHOD FOR FORMING A METAL LINE IN A SEMICONDUCTOR DEVICE

CROSS-REFERENCES TO RELATED APPLICATIONS

The present application claims priority to Korean patent application number 10-2007-085422, filed on Aug. 24, 2007, which is incorporated by reference in its entirety.

BACKGROUND OF THE INVENTION

The present invention relates to a method for forming a metal line in a semiconductor device, and more particularly, to a method for forming a metal line in a semiconductor device, which can easily apply a material for a contact plug into a contact hole.

A semiconductor device includes a plurality of memory cells and a plurality of transistors which are connected with one another by junction areas, contact plugs and metal lines.

Contact plugs transmit the voltages, provided thereto mainly through metal lines, to the gates or the source or drain areas of transistors. For example, in the case where a contact plug is formed between two transistors, the contact plug is formed over a junction area (a source or drain area). The contact plug transmits the voltage, provided thereto through a metal line, to the junction area (the source or drain area). If a transistor is activated, a channel is formed, and the voltage provided to the junction area (the source or drain area) is transmitted through the channel to another transistor.

The contact plug formed over the junction area (the source or drain area) does not contact the gate. An insulation layer is formed between the gate and the contact plug to isolate the contact plug from the gate.

A conventional method for forming a contact plug is described below.

An insulation layer is an oxide-based layer formed on a semiconductor substrate to insulate a transistor formed on the semiconductor substrate. A first insulation layer pattern, in which an area to be defined with a contact hole is open, is formed on the insulation layer. By implementing an etching process using the first insulation layer pattern, the exposed portion of the insulation layer is removed, and a contact hole is defined. The contact hole is filled with a metal layer to form a contact plug. However, an overhang phenomenon, in which the metal layer is quickly formed at the upper end of the contact hole (i.e., at the upper edge of the insulation layer), is likely to occur. If the overhang phenomenon occurs, voids can be formed in the contact plug because the upper end of the contact hole may be closed before the contact hole is completely filled with the metal layer.

If voids are formed in the contact plug, $H_2O_2$ used during a subsequent planarization process can leak into the voids, causing damage to the metal layer. Thus, the electrical characteristics of a semiconductor device can be degraded.

SUMMARY OF THE INVENTION

An embodiment of the present invention is directed to a method for forming a metal line in a semiconductor device. After a first metal layer is formed in a contact hole, an etching process is implemented to decrease the aspect ratio of the contact hole. A barrier layer is formed over the first metal layer to subsequently form a second metal layer in a selective manner. Thus, the number of processes can be decreased and the resistance of a contact plug can be reduced.

In one aspect, a method for forming a metal line in a semiconductor device comprises providing a semiconductor substrate in which contact plugs are formed in contact holes defined in an interlayer dielectric. Upper portions of the contact plugs are etched. A first barrier layer is formed on a surface of the interlayer dielectric including the contact plugs. A second barrier layer is formed on the first barrier layer over the interlayer dielectric. The second barrier layer has lower compatibility with a metallic material than the first barrier layer. A first metal layer is formed over the first and second barrier layers. The first metal layer and the first and second barrier layers are then patterned.

In another aspect, a method for forming a metal line in a semiconductor device comprises providing a semiconductor substrate having an interlayer dielectric including contact plugs. A first barrier layer is formed on surfaces of the contact plugs and the interlayer dielectric. The first barrier layer has high compatibility with a metallic material. A second barrier layer is formed on the first barrier layer that is formed over the interlayer dielectric. The second barrier layer has lower compatibility with the metallic material than the first barrier layer. A metal layer is then formed on the first barrier layer in a selective manner.

DESCRIPTION OF SPECIFIC EMBODIMENT

Reference will now be made in greater detail to a specific embodiment of the invention, an example of which is illustrated in the accompanying drawings. It is noted that the present invention must not to be construed as being limited by the present embodiment and can be realized in a variety of ways. The present embodiment is provided to make the disclosure of the present invention complete and to allow the person having ordinary knowledge in the art to better understand the scope of the present invention.

FIGS. 1A through 1G are sectional views illustrating a method for forming a metal line in a semiconductor device in accordance with an embodiment of the present invention.

Figure 1A:
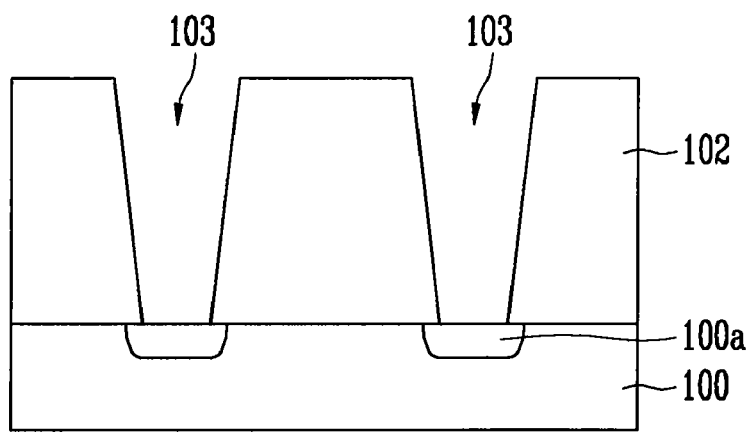
FIGS. 1A through 1G are sectional views illustrating a method for forming a metal line in a semiconductor device in accordance with an embodiment of the present invention.

Referring to FIG. 1A, a semiconductor substrate 100 is provided. The substrate 100 is formed with semiconductor elements including a plurality of transistors (not shown). A first insulation layer 102 for an interlayer dielectric is formed on the semiconductor substrate 100 such that the semiconductor elements (not shown) are covered by the first insulation layer 102. By pattering the first insulation layer 102, contact holes 103 are defined to expose junction areas 100a. The first insulation layer 102 can be formed as an oxide layer. To reduce the resistance of the junction areas 100a, a plug ion implantation process implants impurities through the contact holes 103 for the exposed junction areas 100a. A barrier layer (not shown) may be formed on the surfaces of the contact holes 103. The barrier layer may be formed as a TiN layer through metal-organic chemical vapor deposition (MOCVD).

Figure 1B:
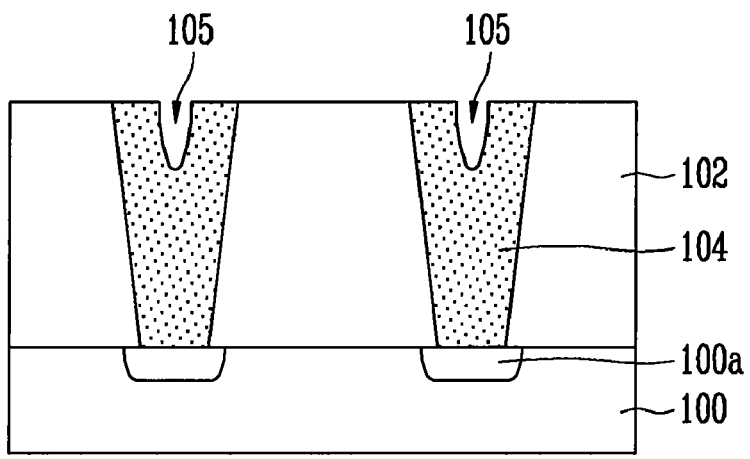

Referring to FIG. 1B, a first metal layer 104 for forming contact plugs is formed in the contact holes 103. Alternatively, after forming the barrier layer on the surfaces of the contact holes 103, the first metal layer 104 can be formed. It is preferred that the first metal layer 104 be formed of tungsten (W). However, when forming the first metal layer 104 in the contact holes 103 having a narrow width, portions of the first metal layer 104 formed on the sidewalls of the contact holes 103 are likely to contact each other so that seams 105 are created. Also, due to a bowing phenomenon, voids are likely to be formed in the contact holes 103. The seams 105 or voids can cause the leakage of an etching solution when subsequently implementing an etching process, thereby damaging contact plugs. During a planarization process to expose the first insulation layer 102, the seams 105 or the voids may be exposed.

Figure 1C:
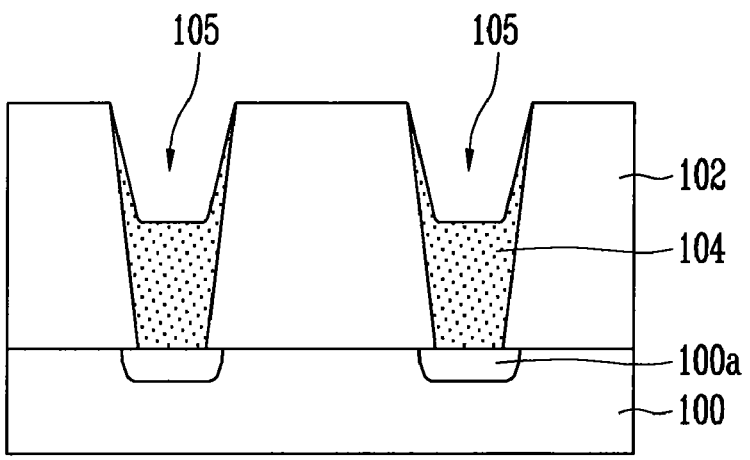

Referring to FIG. 1C, if the etching solution leaks into the seams 105 or voids during a subsequent etching process, the contact plugs may be damaged. Therefore, an etching process is implemented to increase the width of the seams 105 and thereby decrease the aspect ratio thereof. It is preferred that the etching process is a wet etching process. As the width and the depth of the seams increase during the wet etching process, the first metal layer 104 is formed such that a center portion thereof is lower than a peripheral portion thereof.

Figure 1D:
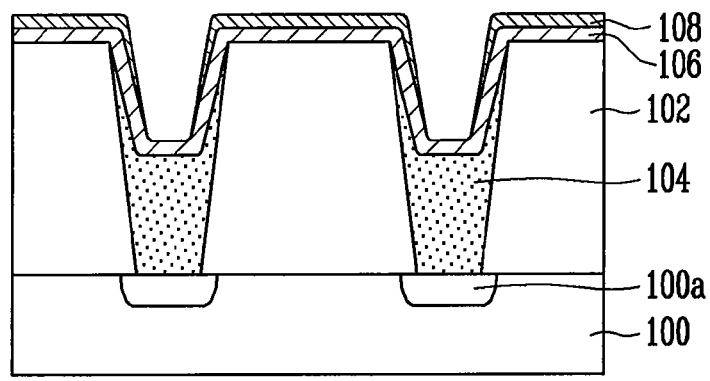

Referring to FIG. 1D, a first barrier layer 106 and a second barrier layer 108 are formed on the surfaces of the first metal layer 104 and the first insulation layer 102 to subsequently form a metallic material on the first metal layer 104 in a selective manner.

It is preferred that the first barrier layer 106 has high compatibility with a second metal layer 110 (see FIG. 1E) to be subsequently formed and has low reactivity with the first metal layer 104. For example, the first barrier layer 106 can be formed of titanium (Ti) at a thickness of 50 Å to 150 Å.

In order to improve the compatibility of the first barrier layer 106 with the second metal layer 110 (see FIG. 1E) to be subsequently formed, before the process for depositing the first barrier layer 106 is completed, nitrogen ($N_2$) gas and argon (Ar) gas are supplied into a chamber, and the temperature of the chamber is raised. Preferably, the nitrogen gas is supplied in the amount of 30 sccm to 100 sccm. Thus, the surface of the first barrier layer 106 (i.e., a Ti layer) becomes a TixN layer. A titanium-rich TixN layer includes more Ti than N.

It is preferred that the second barrier layer 108 has low reactivity with the second metal layer 110 (see FIG. 1E) to be subsequently formed. For example, the second barrier layer 108 can be formed as a TiN layer which contains more N when compared to the first barrier layer 106. In particular, it is preferred that the second barrier layer 108 has a low step coverage characteristic. For example, the second barrier layer 108 can be formed through physical vapor deposition (PVD). Thus, the second barrier layer 108 is formed on the first barrier layer 106 to be thicker over the first insulation layer 102 than in the contact holes 103. By this deposition method, the second barrier layer 108 is formed on the first barrier layer 106 over the first insulation layer 102 to have a thickness of 100 Å to 200 Å, and is formed on the first barrier layer 106 in the contact holes 103 to have a very small thickness. Specifically, due to the low step coverage characteristic, the second barrier layer 108 is not substantially formed on the surface of the first barrier layer 106 on the sidewalls of the contact holes 103 such that the first barrier layer 106 is exposed.

Figure 1E:
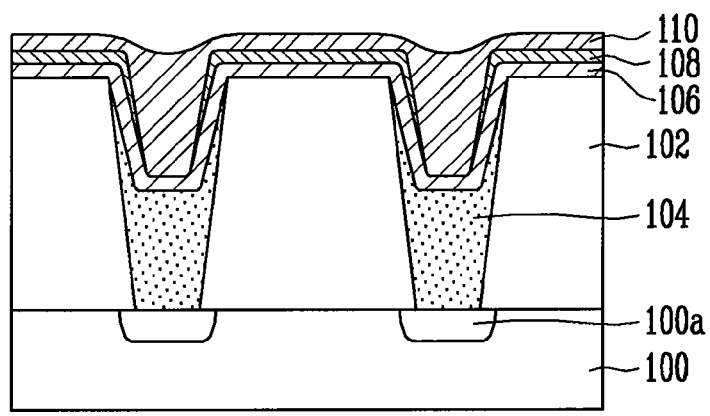

Referring to FIG. 1E, the second metal layer 110 for metal lines is formed on the second barrier layer 108. The second metal layer 110 can be formed of aluminum (Al) having low resistance. It is preferred that aluminum be deposited through chemical vapor deposition (CVD). Since the aspect ratio is decreased in the first metal layer 104, the second metal layer 110 can be easily formed.

Because the second metal layer 110 is deposited more actively on the surface of the first barrier layer 106 having high compatibility with the second metal layer 110, the second metal layer 110 is formed to have a larger thickness in the contact holes 103 where the first barrier layer 106 is substantially exposed. The second barrier layer 108 may be thinly formed or may not be substantially formed on the first barrier layer 106 over the first metal layer 104 depending upon the width of the contact holes 103. Since the second metal layer 110 is formed more easily on an area where the second barrier layer 108 is thinly formed than an area where the second barrier layer 108 is thickly formed, selective formation of the second metal layer 110 becomes possible.

After the second metal layer 110 is formed through CVD, the temperature of the chamber is raised such that the second metal layer 110 can flow over the first metal layer 104 in the contact holes 103. The same metallic material (for example, aluminum) as the second metal layer 110 is additionally formed on the semiconductor substrate 100 with the second metal layer 110 in the chamber at room temperature. Heat is applied to allow the metallic material to flow down in the contact holes 103. For example, heat can be applied by supplying heating gas. Thus, the second metal layer 110 can have a flattened upper surface to prevent the formation of voids.

Figure 1F:
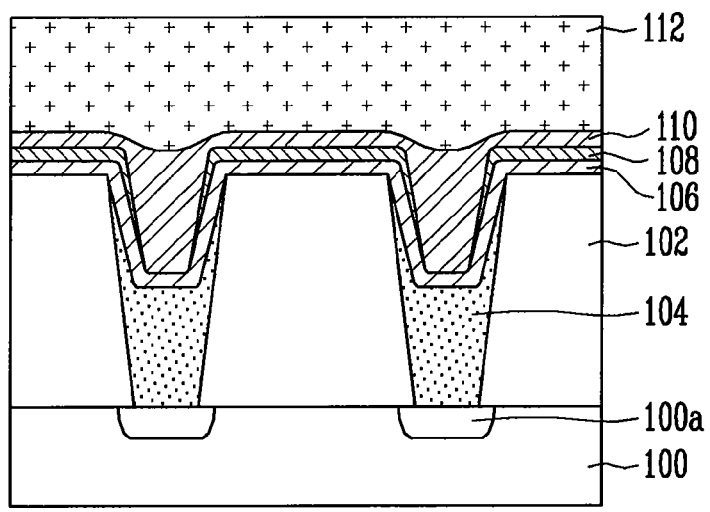

Referring to FIG. 1F, a third metal layer 112 for metal lines is formed on the second metal layer 110. The third metal layer 112 can be formed of aluminum having low resistance. The third metal layer 112 can be formed through PVD to have a thickness of 800 Å to 1,000 Å. The PVD can be implemented under a temperature of 300° C. to 500°.

Figure 1G:
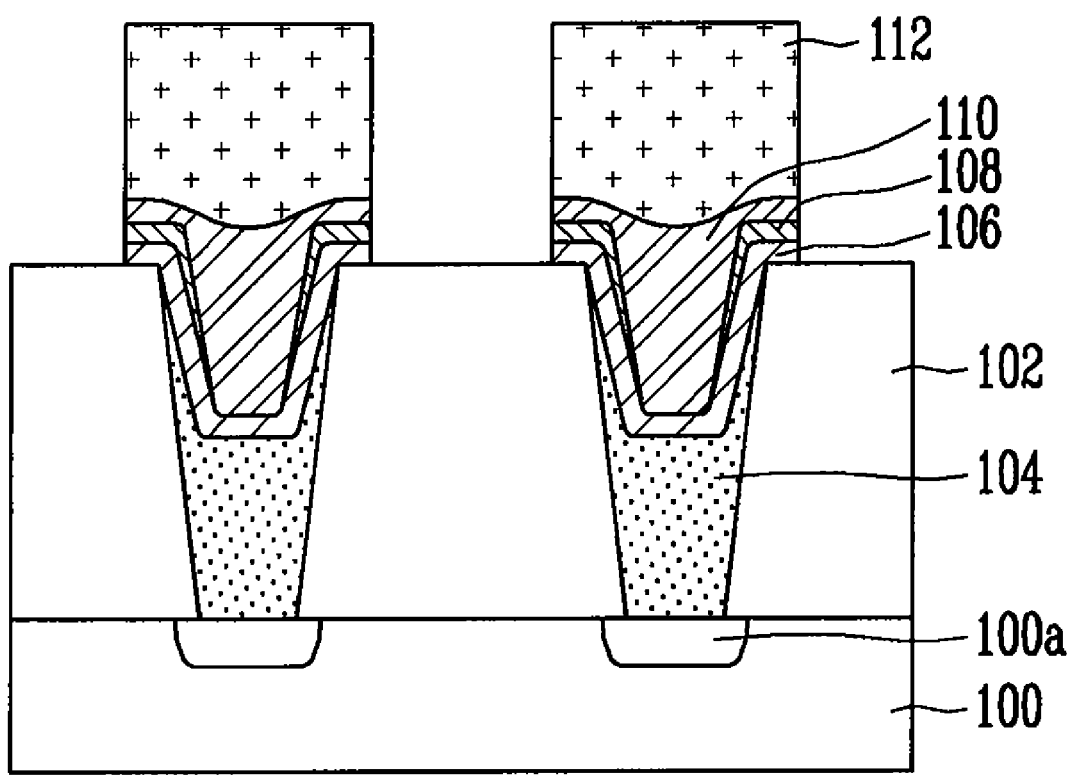

Referring to FIG. 1G, a hard mask pattern (not shown) having a pattern of metal lines is formed on the third metal layer 112. By implementing an etching process using the hard mask pattern, the third metal layer 112, the second metal layer 110, the second barrier layer 108, and the first barrier layer 106 are sequentially patterned.

As a result, contact plugs and metal lines can be simultaneously formed. Since a planarization process can be omitted from the processes for forming metal lines, processing time and cost can be decreased. Also, because the second metal layer 110 can be selectively formed for areas, a gap fill process can be easily implemented.

As is apparent from the above description, in the present invention, after a first metal layer is formed in a contact hole, an etching process is implemented to decrease the aspect ratio of the contact hole, and a barrier layer is formed over the first metal layer to subsequently form a second metal layer in a selective manner. As a result, it is possible to decrease the roughness of a metal line and prevent unevenness from being caused, a contact plug and the metal line can be simultaneously formed, and a planarization process can be omitted. Thus, the number of processes for forming the metal line can be decreased and manufacturing costs can be reduced.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for forming a metal line in a semiconductor device, the method comprising:
providing a semiconductor substrate in which contact plugs are formed in contact holes defined in an interlayer dielectric;
etching upper portions of the contact plugs;
forming a first barrier layer over a surface of the interlayer dielectric including the contact plugs;
forming a second barrier layer over the first barrier layer, wherein the second barrier layer is formed such that the first barrier layer formed over the surfaces of the contact plugs is exposed, and the second barrier layer has lower compatibility with a metallic material than the first barrier layer;

forming a first metal layer over the first barrier layer and the second barrier layer; and patterning the first metal layer, the first barrier layer and the second barrier layer.

2. The method according to claim 1, wherein the contact plugs comprise tungsten.

3. The method according to claim 1, wherein etching upper portions of the contact plugs comprises wet etching to increase a width of seams generated in the contact plugs thereby decreasing an aspect ratio of the seams.

4. The method according to claim 1, further comprising, before forming the contact plugs, performing an ion implantation process for junction areas exposed through the contact holes.

5. The method according to claim 4, further comprising, after performing the ion implantation process, forming a third barrier layer on surfaces of the contact holes.

6. The method according to claim 5, wherein the third barrier layer comprises a Ti layer, a TiN layer or a combination thereof.

7. The method according to claim 6, wherein the TiN layer is formed through metal-organic chemical vapor deposition.

8. The method according to claim 1, wherein the first barrier layer comprises a stack including a Ti layer and a TixN layer, wherein x is a number greater than 1.

9. The method according to claim 8, wherein the Ti layer is formed to have a thickness in a range of 50 Å to 150 Å.

10. The method according to claim 8, wherein the TixN layer is formed by supplying nitrogen gas while depositing the Ti layer.

11. The method according to claim 10, wherein, after supplying the nitrogen gas, argon gas is introduced into a chamber and a temperature of the chamber is raised.

12. The method according to claim 1, wherein the second barrier layer comprises a TiN layer.

13. The method according to claim 12, wherein the TiN layer contains more N than the first barrier layer.

14. The method according to claim 12, wherein the TiN layer is formed to have a low step coverage characteristic.

15. The method according to claim 12, wherein the TiN layer is formed to have a thickness in a range of 100 Å to 200 Å.

16. The method according to claim 1, wherein the first metal layer comprises an aluminum layer.

17. The method according to claim 16, wherein the aluminum layer is formed through chemical vapor deposition.

18. The method according to claim 1, further comprising, after the step of forming the first metal layer:

forming a second metal layer;

raising a temperature of a chamber such that the second metal layer flows into the contact holes; and forming a third metal layer over the second metal layer.

19. The method according to claim 18, wherein the second metal layer and the third metal layer comprise aluminum layers.

20. The method according to claim 18, wherein the third metal layer is formed through physical vapor deposition under a temperature in a range of 300° C. to 500°.

21. The method according to claim 18, wherein the third metal layer is formed to have a thickness in a range of 800 Å to 1,000 Å.

22. A method for forming a metal line in a semiconductor device, the method comprising:

providing a semiconductor substrate comprising an interlayer dielectric including contact plugs formed in contact holes;

forming a first barrier layer over surfaces of the contact plugs and the interlayer dielectric, wherein the first barrier layer has high compatibility with a metallic material;

forming a second barrier layer over the first barrier layer, wherein the second barrier layer is formed such that the first barrier layer formed over the surfaces of the contact plugs is exposed, and the second barrier layer has a lower compatibility with the metallic material than the first barrier layer; and forming a metal layer over the first barrier layer in a selective manner.

23. The method according to claim 22, wherein the first barrier layer comprises a Ti layer.

24. The method according to claim 22, wherein the second barrier layer comprises a TiN layer.

25. The method according to claim 22, wherein the metal layer comprises aluminum.

* * * * *